United States Patent [19]

Weng

[11] Patent Number: 5,184,125

[45] Date of Patent: Feb. 2, 1993

[54] DATA ENCODING AND DEMODULATION SYSTEM

[75] Inventor: Lih-Jyh Weng, Lexington, Mass.

[73] Assignee: Digital Equipment Corporation, Maynard, Mass.

[21] Appl. No.: 798,858

[22] Filed: Nov. 22, 1991

Related U.S. Application Data

[63] Continuation of Ser. No. 373,804, Jun. 28, 1989, abandoned.

[51] Int. Cl.$^5$ .............................................. H03M 7/00
[52] U.S. Cl. ........................................ 341/59; 360/40
[58] Field of Search ............... 341/55, 59, 60; 360/39, 360/40; 375/110, 114

[56] References Cited

U.S. PATENT DOCUMENTS

| | | | |
|---|---|---|---|
| 3,647,964 | 3/1972 | Tang | 341/59 |
| 3,689,899 | 9/1972 | Franaszek | 341/59 |
| 3,716,851 | 2/1973 | Neumann | 341/67 |
| 4,451,819 | 5/1984 | Beckenhauer | 341/59 |
| 4,463,344 | 7/1984 | Adler et al. | 341/59 |
| 4,484,176 | 11/1984 | Fitzpatrick | 341/59 |
| 4,670,890 | 6/1987 | Titchener | 375/110 |
| 4,691,193 | 9/1987 | Khu | 341/67 |
| 4,697,167 | 9/1987 | O'Keeffe et al. | 341/59 |
| 4,737,765 | 4/1988 | Minuhin | 341/67 |
| 4,760,378 | 7/1988 | Iketani et al. | |
| 4,860,324 | 8/1989 | Satomura | 341/59 |
| 4,881,076 | 11/1989 | Ashley et al. | 341/59 |

FOREIGN PATENT DOCUMENTS

| | | |
|---|---|---|
| 0094293 | 4/1983 | European Pat. Off. . |
| 0271317 | 12/1987 | European Pat. Off. . |
| 57-51552 | 10/1983 | Japan . |
| 8501402 | 9/1984 | PCT Int'l Appl. . |

OTHER PUBLICATIONS

Electronics. vol. 58, No. 14, Apr. 1985, New York US pp. 55–59; M. Roth: "Mass Storage Gets New Boost". Xerox Disclosure Journal. vol. 5, No. 6, Nov. 1980, Stamford, Conn. US pp. 647–648; K. A. Norris: "Run Length Limited Codes".
IBM Technical Disclosure Bulletin. vol. 27, No. 7b, Dec. 1984, NY US pp. 4274–4277; H. Gardner: "Mark Generation in 2,7 Code".

*Primary Examiner*—Marc Hoff
*Attorney, Agent, or Firm*—Cesari and McKenna

[57] ABSTRACT

A data encoding system encodes data using the following d=7, k=2 code:

| DATA BITS | CODE WORDS |
|---|---|
| 00 | 000X |
| 01 | 0100 |
| 10 | 100X |
| 011 | 10000X |
| 111 | 100100 |
| 0000 | 1000000X | where X is a ONE if the last two bits of the preceding code word are both ZEROS and a ZERO otherwise, and the right-most bits are the first in time. The system encodes the data by encoding the first four bits of data to an eight-bit code word if the bits are all ZEROS and the last two bits of the previous code word are in a predetermined pattern. If the first four bits are not ZEROS and the system encodes the first three data bits to form a six-bit code word if the first two bits are both ONES. Otherwise, the system encodes the first two data bits to form a four-bit code word. The system selects the code word which preserves the code limited run length. The system also includes a data demodulator which demodulates data which is encoded according to the chart. The demodulator first sets the first two bits of encoded data to ZEROS. It then compares the first eight, six or four encoded bits to the code words and decodes the bits according to the code word chart. The code also allows the system to synchronize to the code words by finding appropriate bit patterns in the encoded data.

42 Claims, 3 Drawing Sheets

DATA ENCODING AND DEMODULATION SYSTEM

CROSS-REFERENCE TO RELATED CASES

This is a continuation of application Ser. No. 07/373,804, filed Jun. 28, 1989, now abandoned.

FIELD OF INVENTION

The invention relates generally to the field of signal demodulation and more particularly to the encoding of data to facilitate demodulation of signals recorded on mass storage media, for example, signals used for storing data in a digital data processing system, to identify the digital data represented thereby.

BACKGROUND OF INVENTION

Binary digital data is typically recorded on mass storage media as a pattern of transitions in a storage medium. For example, data on magnetic storage media is represented by changes of magnetic polarity, and data on optical storage media is represented by changes in reflectivity or transmissivity. The transition patterns correspond to digital data which has been encoded to facilitate recording. When a magnetic memory is read using an inductive read head, or an optical memory is read using an optical scanner, an analog signal is generated with relative positive and negative peaks or large and small signals corresponding to the transition pattern. The analog signal, which may be distorted by system noise and other influences, is then demodulated to extract the original transition pattern as faithfully as possible and interpret it as a series of binary encoded bits. The binary encoded bits must then be decoded to reproduce the original digital data.

Signal demodulation may become increasingly difficult as the density of data recorded on the disks is increased. With higher recording densities, the medium, or disk, space allotted for the recording of a transition signal, that is, a transition cell, is, in effect, reduced. The signals read from the transition cells tend to be smaller relative to the background noise as a result and they can be more readily misinterpreted.

The signals may be misinterpreted because of system noise, which can distort the signals read from the "small" transition cells, or because of interference from surrounding transition cells, which can cause signal peaks to shift either within a transition cell or even to adjacent transition cells. The misinterpretation of the transition signals results in errors in the binary encoded bits which, after decoding, results in errors in the digital data.

The need to encode data specifically to facilitate demodulation and minimize the effects of peak shifts, etc., is well known. One such encoding scheme is shown in U.S. Pat. No. 4,146,909 to Beckenhaur et al., assigned to International Business Machines, Inc. (IBM). Data which may already be encoded for error correction is further encoded using a demodulation code, for example, the IBM code, before it is recorded on the storage medium. Thus the data is recorded in the form of a series of transitions corresponding to the demodulation code words.

When a user requests data from storage the demodulation code words corresponding to the data are retrieved; that is, an analog signal is produced from the stored transition pattern. The analog signal corresponding to the code words must then be demodulated. Demodulation of the code word signal requires first determining the binary values corresponding to the signal transitions, and thus, the bit values, and next, finding the beginnings of the code words and decoding them. The resulting data may then be further decoded, for example, for error correction, to reproduce the actual data.

In order to facilitate demodulation the data is encoded such that the effects of signal transitions on nearby transition cells, for example, peak shifts, in the data signal are minimized. The data is typically encoded using a code which separates consecutive binary ONES, which correspond to transition cells containing signal transitions or peaks, by a minimum of one or more binary ZEROS, which correspond to transition cells without signal transitions.

To further facilitate the determination of the bit values associated with the recorded signal, the data is encoded such that the data signal, which typically includes clock information which enables the demodulator to find and synchronize to the signal transition cells, has a limited number of consecutive binary ZEROS. A ZERO is represented by a transitionless cell, and thus, too many consecutive ZEROS may result in the demodulator losing clocking information. Codes having these limitations for both ONES and ZEROS are commonly referred to as "run-length-limited" codes.

The IBM code discussed above is a run-length-limited code which separates consecutive ONES in a code word by at least two ZEROS. The parameter d is commonly associated with this minimum number of ZEROS, and thus, d=2. The IBM code allows at most seven consecutive ZEROS. The parameter k is commonly associated with the maximum number of ZEROS, and thus, k=7. Codes for which d and k are both small numbers and relatively close to each other are best suited for demodulation encoding.

The IBM code using these d and k parameters encodes groups of two, three and four data bits into any of seven code words. The number of valid code words in a code determines the complexity of the corresponding encoder and demodulator. Thus codes which contain fewer code words may use less complex encoders and demodulators.

SUMMARY OF THE INVENTION

The invention is a data storage system including an encoder and a demodulator which encodes and demodulates data, respectively, using an improved d=2, k=7 demodulation code. The encoder encodes one data bit to two code Word bits, and thus, the code rate is ½.

In brief summary, the encoder encodes data to form any of six possible code words according to the following code word chart:

CHART 1

| DATA BITS | CODE WORDS |
|-----------|------------|
| 00 | 000X |
| 01 | 0100 |
| 10 | 100X |
| 011 | 10000X |
| 111 | 100100 |
| 0000 | 1000000X | where X is a ONE if the last two bits of the preceding code word are both ZEROS and X is a ZERO otherwise, and the right-most bits of the data and the code words are the first in time.

First, an encoder examines four incoming data bits. If the four bits are all ZEROS the encoder next examines the last two bits of the previous code word to determine if the bits are 01. If they are, the encoder encodes the first two of the four ZERO bits to form one of the four-bit code words in the Chart 1 above. The encoder selects the four bit code word which preserves the limited run length, and thus, it selects 0000. Otherwise, the encoder encodes the four ZERO bits to form one of the two eight-bit code words in the code word Chart 1 above. The encoder selects the eight-bit code word which preserves the limited run length of the code. For example, if the two previous bits are 00 the encoder selects 10000001.

If the four data bits are not all ZEROS, the encoder next examines just the first two data bits. If these bits are both ONES the encoder encodes the two data bits along with the third data bit to form a six-bit code word according to the chart. Otherwise, the encoder encodes the first two data bits to form a four-bit code word according to the chart.

After these data bits are encoded, the encoder applies the code word to storage, for example, a disk drive, where it is stored for future use. The encoder also retains a copy of the last two bits of the code word. The encoder then continues to encode any incoming data according to the chart and applying it to the disk.

When data is requested from storage, the code words corresponding to the data, that is, the recorded signals, are retrieved from the disk. The data signal is then applied to a demodulator. The demodulator synchronizes to the signal, assigns bit values to it, and then attempts to decode code words.

Specifically, it first attempts to decode the first eight bits of the encoded data. It sets the first two encoded bits to ZEROS and then compares the eight bits, two of which are set to ZERO, to the valid code word 10000000. If the encoded data bits match a code word the code word decodes to four data ZEROS. Otherwise, the demodulator attempts to decode the first six bits to three data bits and if this fails it decodes the first four bits to two data bits. If the code word bits can not be decoded according to the chart an error is declared for the first two data bits.

DESCRIPTION OF THE DRAWINGS

The above and further advantages of the invention may be better understood by referring to the following description in conjunction with the accompanying drawings, in which.

DETAILED DESCRIPTION OF THE ILLUSTRATIVE EMBODIMENT

Figure 1:
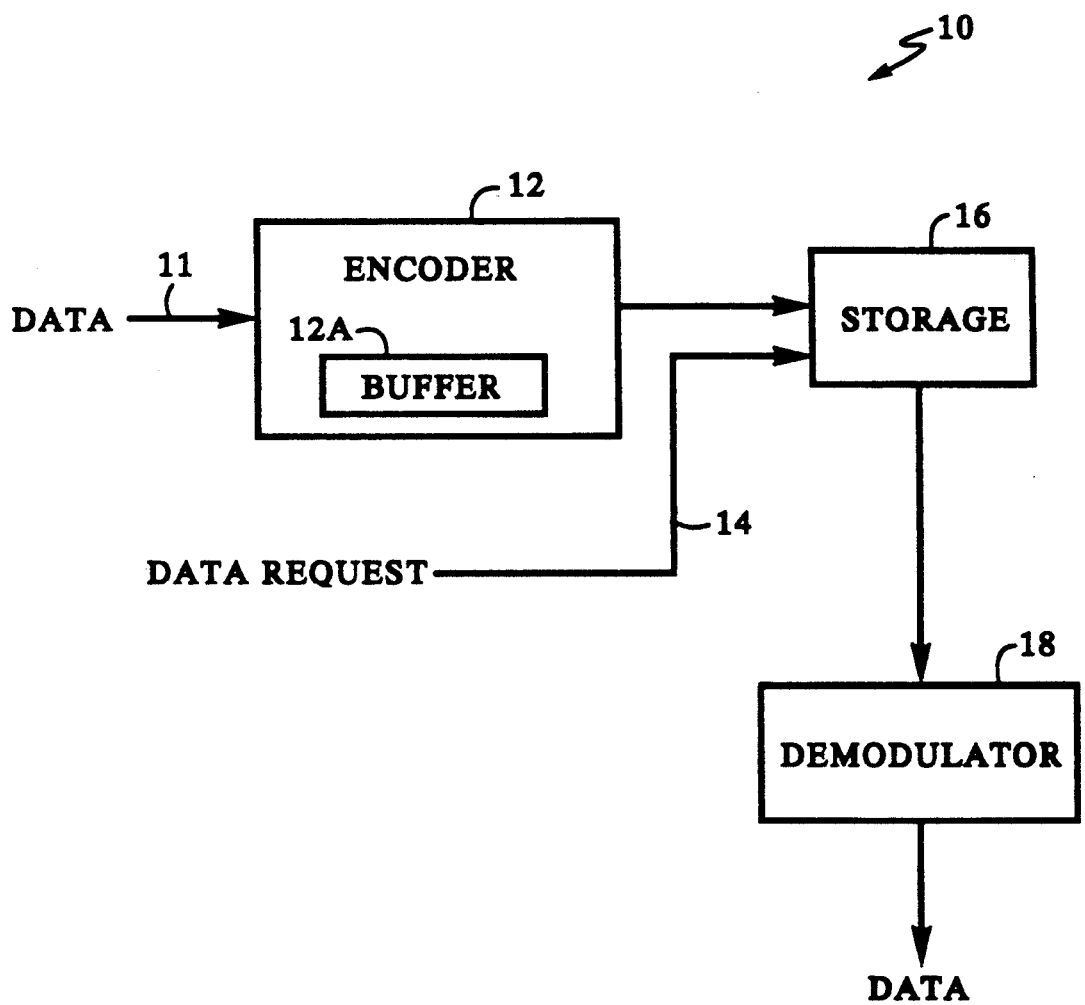
FIG. 1 is a block diagram of an encoding and demodulation system.

A data storage and retrieval system 10 includes an encoder 12, storage 16, for example, a disk drive, and a demodulator 18. The encoder 12 receives from a data bus 11 data bits which may have already been encoded for error correction purposes. The encoder further encodes the data bits into a code word using a $d=2$, $k=7$ code designed to facilitate demodulation, as discussed below with reference to FIG. 2. The encoder then applies the code word to the disk drive 16. The encoder also retains in a buffer 12A a copy of the last two bits of the code word.

When the encoder 12 encodes the next few data bits it examines the retained bits and selects a code word for the data which preserves the limited run length ($d=2$, $k=7$) of the code. Once the encoder 12 has encoded the data the disk drive 16 stores the code words on a magnetic disk as a series of signal transitions, i.e., a series of flux reversals.

When a user requests stored data a data request signal 14 is sent to the disk drive 16. The drive 16 retrieves from the magnetic disk the signal corresponding to the data and applies the signal to the demodulator 18. The demodulator 18 synchronizes to the signal and assigns binary bit values to it. The demodulator 18 next decodes the data if possible, as discussed below with reference to FIG. 3. The demodulated data may be applied to an error correction decoder (not shown) for further decoding and correction, as appropriate.

To encode the incoming data the encoder 12 uses the code words set forth in Chart 1 below:

CHART 1

| DATA BITS | CODE WORDS |
| --- | --- |
| 00 | 000X |
| 01 | 0100 |
| 10 | 100X |
| 011 | 10000X |
| 111 | 100100 |
| 0000 | 1000000X | where X is a ONE if the last two bits of the preceding code word are both ZEROS and X is a ZERO otherwise, and the right-most bits of the data and the code words are the first in time.

Figure 2:
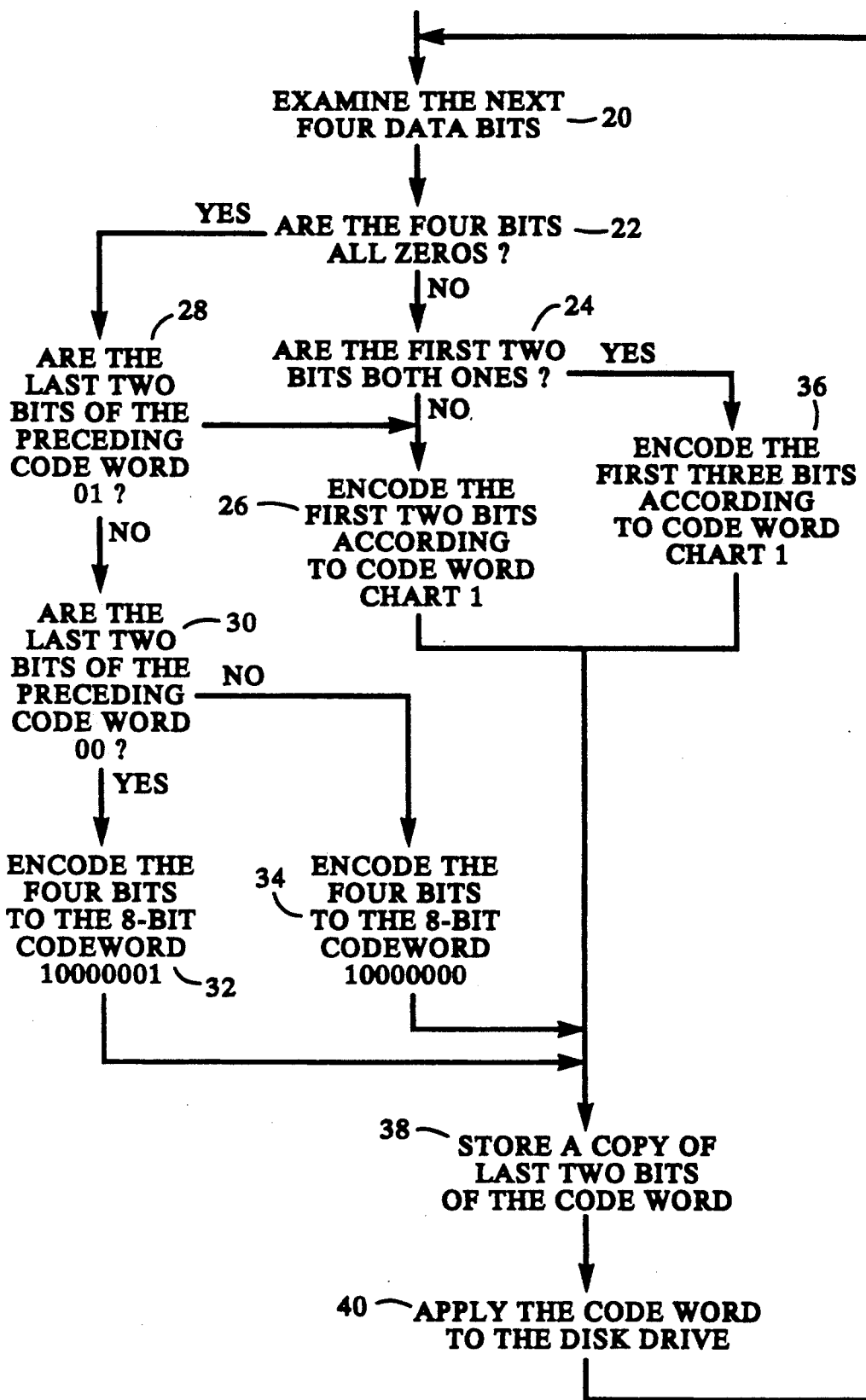
FIG. 2 is a flow chart of the operations of an encoder encoding data in accordance with the invention.

With reference to FIG. 2, the encoder 12 examines the next four incoming data bits to determine if all the bits are ZEROS (steps 20-22). If the bits are all ZEROS the encoder 12 examines the last two bits of the previous code word stored in buffer 12A (FIG. 1). Unless the two stored bits are 01, the encoder 12 encodes the four ZERO bits into an eight-bit code word which preserves the limited run-length of the code (steps 28-34). Thus, if the stored bits are both ZEROS, the encoder encodes the data bits to form the code word 10000001 to avoid too many consecutive ZEROS (steps 30-32). If the stored bits are 10 the encoder encodes the data bits to form the code word 10000000 to avoid consecutive ONES (steps 30, 34). If the stored bits are 01 the encoder encodes the first two of the four ZERO bits to form a four-bit code word 0000 (step 26).

If the four data bits are not all ZEROS the encoder examines the first two data bits to determine if they are both ONES (step 24). If they are, the encoder encodes these two data bits and the next one to form a six-bit code word according to Chart 1 (step 36). For example, if the third data bit is a ONE the encoder 12 encodes the three data bits, 111, to form the code word 100100.

If the first two incoming data bits are not both ONES the encoder encodes the two data bits to form a four-bit code word according to Chart 1 (step 26). For example, the two data bits may be 01 and the encoder produces the corresponding code word 0100.

After the encoder formulates a code word it applies the code word to the disk drive 16. The encoder also retains a copy of the last two bits of the code word in buffer 12A (steps 38-40).

The encoder 12 then examines the next four data bits which have not yet been encoded. For example, if the encoder first examines four bits, $b_4$, $b_3$, $b_2$, $b_1$, and the first two data bits $b_2$ and $b_1$ to form a four-bit code word, the encoder next examines the two bits which have not yet been encoded, bits $b_4$ and $b_3$, along with the next two incoming data bits, bits $b_5$ and $b_6$. If the encoder encodes these four examined data bits $b_6$, $b_5$, $b_4$, and $b_3$ to a code word, it then examines the next four incoming data bits $b_{10}$, $b_9$, $b_8$, and $b_7$ to determine if these bits are all ZEROS. Thus the encoder encodes the following data bits:

01 00 00 00 00 00 00 01 00 00 10 00 01 where the right-most bit is the first incoming data bit, to form the code words:

0100 0000 <u>1000 0000</u> <u>1000 0001</u> 0000 0100 <u>1000 0000</u> 1001 0000 0100 where the underlined code words are the eight-bit code words corresponding to four all ZERO data bits.

Figure 3:
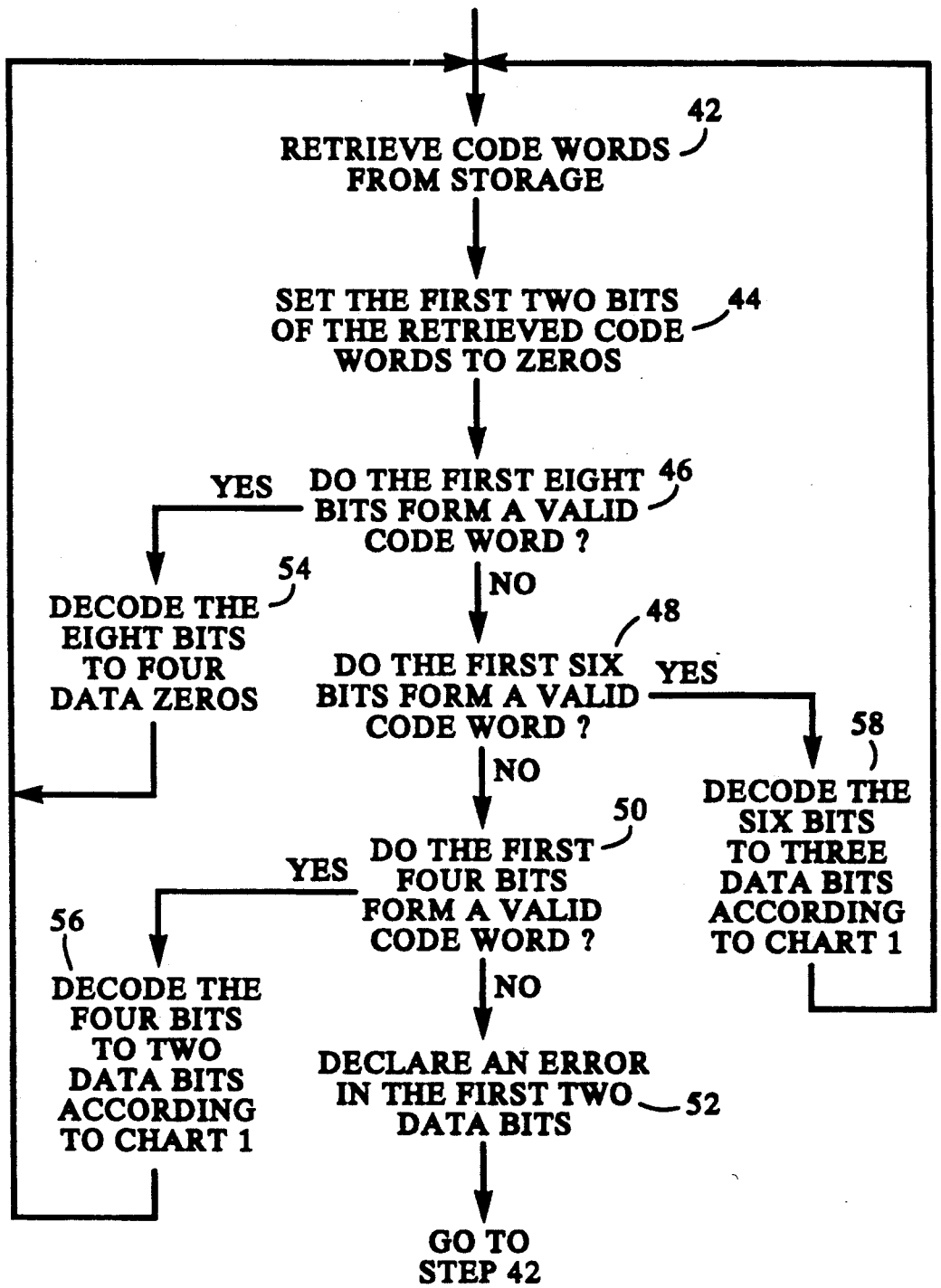
FIG. 3 is a flow chart of the operations of a demodulator decoding the encoded data.

Referring now to FIG. 3, when a data request 14 arrives at the disk drive 16, the disk drive 16 retrieves from the magnetic disk the signal corresponding to the data (step 42). The disk drive then sends the retrieved signal to the demodulator 18. The demodulator 18 assigns bit values to the signal and then attempts to decode the bits as code words. To decode the code words, the demodulator 18 set the first two retrieved bits to ZEROS and then attempts to decode the first eight, six or four bits to four, three or two data bits, as set forth below (steps 44–46).

The decoder sets the first two bits to ZEROS to force to a given format a code word which includes an "X" set to a ONE, for example, 0001 for data bits 00. The value of the "X" term does not add any information to the code word, it simply preserves the desired limited run length. Thus setting the first two bits to ZEROS, and thereby forcing the X terms to ZEROS, simplifies the demodulator 18 by limiting the number of code words which the demodulator 18 must recognize.

The demodulator 18 compares the first eight bits, including the two set to ZEROS, with the eight-bit code word 10000000 shown in Chart 1. If the bits match the code word the demodulator decodes the bits as four data ZEROS (step 54).

If the eight bits do not match the code word, the demodulator 18 compares the first six bits, including the two bits set to ZEROS, with the two valid six-bit code words shown in Chart 1. If the bits match one of the code words the demodulator 18 decodes the code word to the corresponding three data bits (steps 48, 58). Otherwise, the demodulator 18 attempts to decode the first four bits, again including the two bits set to ZEROS, to two data bits according to Chart 1 (steps 50, 56). If the four retrieved bits do not form a valid code word the demodulator 18 declares a detected error in the first two data bits (step 52).

The demodulator 18 easily decodes four-bit code words to two data bits by assigning the data bits the values of the two most significant bits of the four bit code word. Thus the code word 0100 decodes to 01.

Once the demodulator has decoded a first code word or declared the first two bits erroneous, it examines the next eight encoded bits, sets the first two to ZEROS and attempts to decode them to four data bits, and so forth, until all the code words corresponding to the requested data have been decoded.

In order to ensure that the bits which are examined for decoding are bits at the start of a code word rather than bits in the middle of a code word, the demodulator 18 first examines the placement of the ZEROS and ONES in the first few retrieved bits. The demodulator 18 finds the beginning of a code word when it finds a ONE in bit position $b_o$, o being an odd number, which is followed by three or more ZEROS. Similarly, it finds the beginning of a code word if it finds, starting at a bit position $b_o$, either of two eight-bit patterns:

00000100 or 01000100.

The demodulator 18 may instead find the end of a code word by finding a ONE in bit position $b_e$, where e is an even number. The demodulator 18 determines that a particular bit is in an even or odd bit position based on information in the corresponding clock signal, in a manner which is well known to those skilled in the art.

If the demodulator 18 finds a repeated pattern of 0001 in the retrieved data with the ONE in a location corresponding to an odd bit position, the demodulator 18 determines that the retrieved sequence is shifted two bit positions, that is, that the sequence is advanced or delayed by two bits. Thus the demodulator advances two encoded bits to ensure that the pattern 0100 is the repeated one and the demodulation is thus synchronized to the data. It is rare that a properly functioning demodulator advances or delays data by an odd number of bits.

The encoder 12 and the demodulator 18 may encode and decode data using a second code word chart, as set forth below:

CHART 2

| DATA BITS | CODE WORDS |
|---|---|
| 00 | 000X |
| 01 | 0100 |
| 10 | 100X |
| 011 | 10000X |
| 111 | 100100 |
| 0000 | 10000001 | where X is a ONE if the last two bits of the preceding code word are both ZEROS and X is a ZERO otherwise, and the right-most bits of the data and the code words are the first in time.

The only difference between this code and the code shown in Chart 1 is that there is only one valid eight-bit code word. The four data ZEROS are encoded to the eight-bit code word only if the last two bits of the previous code word are ZEROS. Otherwise, the first two ZERO bits are encoded to 0000.

Using the demodulation codes set forth above, a demodulator easily determines the binary values associated with an analog data signal. The code is well suited to synchronizing the demodulator to the signal because it encodes a stream of data ZEROS to code words which preserve the desired limited run-length. It also facilitates synchronization of the demodulator to the beginnings or endings of codewords by encoding the data to code words with ONES in particular, that is, even or odd, bit positions.

In addition, the encoder and demodulator required for the code may be less complex than those used in prior art systems because the present code has only six valid code words.

The foregoing description has been limited to two specific embodiments of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed is:

1. A method of storing data in a storage device in the form of demodulation code words generated from an input string of data bits using a rate $\frac{1}{2}$, run-length limited d=2, k=7 code, the method including the steps of:
   A. retaining in a buffer a predetermined number of bits of a previous demodulation code word, the retained bits being the demodulation code word bits which are at the end of the demodulation code word to which a next generated demodulation code word is to be appended;
   B. encoding the right-most bits of the input string to generate demodulation code words and preliminary code words in accordance with the following:

| DATA BITS | |
|---|---|
| | DEMODULATION CODE WORD |
| 01 | 0100 |
| 111 | 100100 |
| | PRELIMINARY CODE WORD |
| 00 | 000X |
| 10 | 100X |
| 011 | 10000X |
| 0000 | 1000000X | where the right-most bits of the data and the code words are the first in time;
   C. for each preliminary code word examining a predetermined number of the bits retained in the buffer,
      i. if the bits match a first predetermined pattern, appending to the beginning of the preliminary code word a ONE bit to form a demodulation code word,
      ii. if the bits do not match the first predetermined pattern, appending a ZERO bit to the beginning of the preliminary code word to form a demodulation code word,
   D. retaining in the buffer a predetermined number of bits of the demodulation code word formed in steps B and/or C, the retained bits being the demodulation code word bits which are at the end of the demodulation code word to which a next demodulation code word is to be appended, and eliminating from the buffer the bits of the previous demodulation code word;
   E. transmitting the demodulation code word to a storage device and appending the demodulation code word to the previous demodulation code word in the storage device;
   F. removing from the input string the data bits encoded in steps B and/or C; and
   G. repeating steps C-F until the input string has been encoded.

2. The method of storing data of claim 1, wherein the steps of encoding the data to produce demodulation code words include:
   a. examining the next four data bits of the input string and determining if the bits are all ZEROS;
   b. if the four bits are all ZEROS, examining the last two bits retained in the buffer, and determining if these two bits match a second predetermined pattern;
   c. if the two bits retained in the buffer do not match the second predetermined pattern, encoding the four ZERO bits of the input string to form an eight-bit demodulation code word;
   d. if the two bits retained in the buffer are in the second predetermined pattern, encoding the first two ZERO bits to form a four-bit demodulation code word;
   e. if the four bits of the input string are not all ZEROS, determining if the first two bits of the input string are both ONES, and if the bits are both ONES encoding the first three bits of the input string to form a demodulation code word;
   f. if the two bits of the input string are not both ONES, encoding the first two bits of the input string to form a four-bit demodulation code word.

3. The demodulation code word generation method of claim 2, wherein said step of examining a predetermined number of bits retained in the buffer to determine if the bits match a second predetermined pattern includes determining if the two end bits of the bits retained in the buffer match the pattern 01.

4. The method of storing data of claim 1, wherein said step of examining a predetermined number of bits retained in the buffer to determine if the bits match a first predetermined pattern includes determining if the two end bits of the bits retained in the buffer match the pattern 00.

5. A method of storing data in a storage device in the form of demodulation code words generated from an input string of data bits using a rate $\frac{1}{2}$, run-length limited d=2, k=7 code, the method including the steps of:
   A. retaining in a buffer a predetermined number of bits of a previous demodulation code word, the retained bits being the code word bits which are at the end of the demodulation code word to which a next demodulation code word is to be appended;
   B. encoding the right-most bits of the input string to generate demodulation code words and preliminary code words in accordance with the following:

| DATA BITS | |
|---|---|
| | DEMODULATION CODE WORD |
| 01 | 0100 |
| 111 | 100100 |
| 0000 | 10000001 |
| | PRELIMINARY CODE WORD |
| 00 | 000X |
| 10 | 100X |
| 011 | 10000X | where the right-most bits of the data and the code words are the first in time;
   C. for each preliminary code word examining a predetermined number of the bits retained in the buffer,
      i. if the bits match a predetermined pattern, appending to the beginning of the preliminary code word a ONE bit to form a demodulation code word,
      ii. if the bits do not match the predetermined pattern, appending a ZERO bit to the beginning of the preliminary code word to form a demodulation code word, D. retaining in the buffer a predetermined number of bits of the demodulation code word formed in steps B and/or C, the retained bits being the demodulation code word bits which are at the end of the demodulation code word to which a next demodulation code word is to be appended, and eliminating from the buffer the bits of the previous demodulation code word;

E. transmitting the demodulation code word to a storage device and appending the demodulation code word to the previous demodulation code word in the storage device;

F. removing from the input string the data bits encoded in steps B and/or C; and G. repeating steps C-F until the input string has been encoded.

6. The method of storing data of claim 5, wherein the steps of encoding the data to produce demodulation code words include:

a. examining the next four data bits of the input string and determining if the bits are all ZEROS;

b. if the four bits of the input string are all ZEROS, examining the last two bits retained in the buffer, and determining if the two bits are in the predetermined pattern;

c. if the two bits retained in the buffer are in the predetermined pattern, encoding the four ZERO bits of the input string to form an eight-bit demodulation code word;

d. if the two bits retained in the buffer are not in the predetermined pattern, encoding the first two ZERO bits to form a four-bit demodulation code word;

e. if the four bits of the input string are not all ZEROS, determining if the first two bits of the input string are both ONES, and if the bits are both ONES encoding the first three bits of the input string to form a six-bit demodulation code word;

f. if the two bits of the input string are not both ONES, encoding the first two bits of the input string to form a four-bit demodulation code word.

7. The method of storing data of claim 5, wherein said step of examining a predetermined number of bits retained in the buffer to determine if the bits match a predetermined pattern includes determining if the two end bits of the bits retained in the buffer match the pattern 00.

8. A method of retrieving, demodulation and decoding a data signal representing data which has been encoded in accordance with the following d=2, k=7 run-length-limited code:

| DATA BITS | DEMODULATION CODE WORD |
|-----------|------------------------|
| 00        | 000X                   |
| 01        | 0100                   |
| 10        | 100X                   |
| 011       | 10000X                 |
| 111       | 100100                 |
| 0000      | 1000000X               | where X is either a ONE or a ZERO, as appropriate to preserve the run-length of the code and the right-most bits of the data and the code words are the first in time, said method including the steps of:

A. retrieving the data signal from a data storage device;

B. synchronizing to the data signal and assigning bit values to the signal to produce encoded data;

C. decoding the bits of the encoded data in groups as demodulation code words to reproduce data bits by— i. setting the first two bits of encoded data to ZEROS;

ii. comparing the first eight bits of the encoded data with the eight-bit demodulation code word 10000000;

iii. if the bits of the encoded data match the demodulation code word, decoding the eight bits to produce associated data bits;

iv. if the eight bits of the encoded data do not match the demodulation code word, comparing the first six bits of the encoded data with the six-bit demodulation code words;

v. if the first six bits of the encoded data match a demodulation code word, decoding the six bits of the encoded data and producing associated data bits;

vi. if the six encoded bits do not match a demodulation code word, comparing the first four bits of the encoded data with the four-bit demodulation code words and if they match, decoding the four bits of the encoded and producing associated data bits;

vii. if the first four bits of encoded data do not match a demodulation code word, asserting an error signal indicating an error in the first two data bits;

D. transmitting the data bits or the error signal, respectively, to a device requesting the data; and E. repeating steps A—D until the data corresponding to the data signal is decoded.

9. The retrieving, demodulating and decoding method of claim 8, wherein the step of synchronizing to the data signal includes determining the beginning of a demodulation code word by locating at least one of the following patterns in the bit values:

i. a single bit pattern of a ONE in an odd bit position followed by three ZEROS;

ii. a ONE in an add bit position followed by four or more ZEROS;

iii. a bit pattern 00000100 starting at an odd bit position; or iv. a bit pattern 01000100 starting at an odd bit position.

10. The retrieving, demodulating and decoding method of claim 8, wherein the step of synchronizing to the data signal further includes:

A. finding in the encoded data a repeated bit pattern of 0001 with the ONE in an odd bit position;

B. shifting two bit positions such that the repeated pattern is interpreted as 100; and C. locating the beginning of a demodulation code word by finding in the shifted data a ONE in a predetermined bit position or a predetermined pattern.

11. The retrieving, demodulating and decoding method of claim 8, wherein the step of synchronizing to the data signal includes the step of determining the end of a demodulation code word by locating in the encoded data ONE in an even bit position.

12. A data storage system for storing data in the form of demodulation code words generated from an input string of data bits using a rate ½m, run-length-limited d=2, k=7 code, the system including:

A. a buffer for retaining a predetermined number of bits of a previous demodulation code word, the retained bits being the demodulation code word bits which are at the end of the demodulation code word to which a next demodulation code word generated by the system is to be appended;

B. an encoder for encoding the right-most bits of the input string, the encoder including—
   i. means for generating demodulation code words and preliminary code words in accordance with the following:

| DATA BITS | |
|---|---|
| | DEMODULATION CODE WORD |
| 01 | 0100 |
| 111 | 100100 |
| | PRELIMINARY CODE WORD |
| 00 | 000X |
| 10 | 100X |
| 011 | 10000X |
| 0000 | 1000000X | where the right-most bits of the data and the code words are the first in time; and ii. means for forming a demodulation code word from a preliminary code word, the means examining, for each preliminary code word, a predetermined number of the bits retained in the buffer and appending to the beginning of the preliminary code word a ONE bit if the predetermined number of bits match a first pattern, or a ZERO bit if the predetermined number of bits do not match the first pattern, the encoder removing from the input string the encoded data bits;

C. means for sending to the buffer a predetermined number of bits of the demodulation code word generated by the encoder, the bits being the demodulation code word bits which are at the end of the demodulation code word to which a next demodulation code word generated by the encoder is to be appended, the buffer retaining the bits of the generated demodulation code word and eliminating the bits of the previous demodulation code word;

E. transmitting means for transmitting the demodulation code word; and

F. a storage device for receiving the demodulation code word from the transmitting means, the storage device appending the demodulation code word to the previous demodulation code words and storing them on a storage medium in the form of a data signal;

the system repeatedly encoding the remaining data bits until the entire input string has been encoded.

13. The data storage system of claim 12, wherein the encoder includes:
   a. a bit detector for determining ONES and ZEROS in the next four data bits in the input string;
   b. a comparator for comparing the last two bits retained in the buffer to a second predetermined pattern;
   c. first encoding means for encoding the next four bits of the input string if the bit detector determines that the next four bits of the input string are all ZEROS and the comparator determines that the two bits retained in the buffer do not match the second pattern, the first encoding means encoding the four data bits of the input string to form an eight-bit demodulation code word;
   d. second encoding means for encoding the next three data bits of the input string to form a six-bit demodulation code word if bit detector determines that the first two bits of the input string are both ONES, and encoding the next two bits of the input string to form a four-bit demodulation code word if the bit detector determines that the first two bits of the encoded data are not both ONES and the first four bits of the encoded data are not all ZEROS.

14. The data storage system of claim 13, wherein the pattern detector determines if the two end bits of the bits retained in the buffer match the pattern 01.

15. The data storage system of claim 12, wherein the means for forming a demodulation code word from a preliminary code word determines if the two end bits of the bits retained in the buffer bits match the pattern 00.

16. A data storage system for storing data in the form of demodulation code words generated from an input string of data bits using a rate $\frac{1}{2}$, run-length-limited d=2, k=7 code, the system including:

A. a buffer for retaining a predetermined number of bits of a previous demodulation code word, the retained bits being the demodulation code word bits which are at the end of the demodulation code word to which a next demodulation code word generated by the system is to be appended;

B. an encoder for encoding the right-most bits of the input string, the encoder including—
   i. means for generating demodulation code words and preliminary code words in accordance with the following:

| DATA BITS | |
|---|---|
| | DEMODULATION CODE WORD |
| 01 | 0100 |
| 111 | 100100 |
| 0000 | 10000001 |
| | PRELIMINARY CODE WORD |
| 00 | 000X |
| 10 | 100X |
| 011 | 10000X | where the right-most bits of the data and the code words are the first in time, and ii. means for forming a demodulation code word from a preliminary code word, the means examining, for each preliminary code word, a predetermined number of the bits retained in the buffer and appending to the beginning of the preliminary code word a ONE bit if the predetermined number of bits match a predetermined pattern, or a ZERO bit if the predetermined number of bits do not match the predetermined pattern, the encoder removing from the input string the encoded data bits;

C. means for sending to the buffer a predetermined number of bits of the demodulation code word generated by the encoder, the bits being the demodulation code word bits which are at the end of the demodulation code word to which a next demodulation code word generated by the encoder is to be appended, the buffer retaining the bits of the generated code word and eliminating the bits of the previous code word;

E. transmitting means for transmitting the demodulation code word; and

F. a storage device for receiving the demodulation word from the transmitting means, the storage device appending the demodulation code word to the previous demodulation code words and storing them on a storage medium in the form of a data signal;

the system repeatedly encoding the remaining data bits until the entire input string has been encoded.

17. The data storage system of claim 16, wherein the encoder includes:
   a. a bit detector for determining ONES and ZEROS in the includes:
   a. a bit detector for determining ONES and ZEROS in the next four data bits in the input string;
   b. a comparator for comparing the last two bits retained in the buffer to the predetermined pattern;
   c. first encoding means for encoding the next four bits of the input string if the bit detector determines that the next four bits of the input string are all ZEROS, the first encoding means encoding the four data bits of the input string to form an eight-bit demodulation code word if the comparator determines that the two bits retained in the buffer do not match the predetermined pattern;
   d. second encoding means for encoding the next three data bits of the input string to form a six-bit demodulation code word if bit detector determines that the first two bits of the input string are both ONES and encoding the next two bits of the input string to form a four-bit demodulation code word if the bit detector determines that the first two bits are not both ONES and the first four bits are not all ZEROS.

18. The data storage system of claim 16, wherein the means for forming a demodulation code word from a preliminary code word determines if the two end bits of the bits retained in the buffer bits match the pattern 00.

19. A data demodulation system for demodulating and decoding a data signal representing data which has been encoded in accordance with the following d=2, k=7 run-length-limited code:

| DATA BITS | DEMODULATION CODE WORD |
|---|---|
| 00 | 000X |
| 01 | 0100 |
| 10 | 100X |
| 011 | 10000X |
| 111 | 100100 |
| 0000 | 1000000X | where X is either a ONE or a ZERO, as appropriate to preserve the run-length of the code and the right-most bits of the data and the code words are the first in time, said method including the steps of:

A. data retrieval means for retrieving the data signal from a data storage device;

B. synchronzing means for synchronizing to the data signal and assigning bit values to the signal to produce encoded data;

C. a decoder for decoding the bits of the encoded data in groups as demodulation code words to reproduce data bits, the decoder including—
   i. means for setting the first two bits of the encoded data to ZEROS;
   ii. comparing means for comparing the first eight bits of the encoded data with the eight-bit demodulation code word 10000000, the comparing means comparing the first six bits of the encoded data with the six-bit demodulation code words, if the eight bits do not match the code word, and if the six encoded bits do not match a demodulation code word, the comparator comparing the first four bits of the encoded data with the four-bit demodulation code words;
   iii. means for decoding the encoded data bits and producing associated data bits if the comparator determines that the bits match a demodulation code word;
   iv. error signal means for asserting an error signal indicating an error in the first two data bits if the first four bits of encoded data do not match a demodulation code word;

the decoder continuing to decode the bits of the encoded data as demodulation code words until the data signal retrieved from the data storage device is decoded; and D. transmitting means for transmitting the decoded data bits or the error signal, respectively, to a device requesting the data.

20. The data demodulation system of claim 19, wherein the synchronizing means includes means for determining the beginning of a demodulation code word by finding at least one of the following patterns in the encoded data bits;
   i. a single bit pattern of a ONE in an odd bit position followed by three ZEROS;
   ii. a ONE in an odd bit position followed by four or more ZEROS;
   iii. a bit pattern 00000100 starting at an odd bit position; or
   iv. a bit pattern 01000100 starting at an odd bit position.

21. The data demodulation system of claim 19, wherein the means for determining the beginning of a demodulation code word further includes means for:
   A. finding in the encoded data bits a repeated bit pattern of 0001 with the ONE in an odd bit position; and
   B. shifting two bit positions such that the repeated pattern is interpreted as 0100;

the means for finding the beginning of a demodulation code word finding the beginning of a code word by locating in the shifted data a ONE in a predetermined bit position or a predetermined bit pattern.

22. The data demodulation system of claim 21, wherein the system further includes means for determining the end of a demodulation code word by finding in the encoded data bits a ONE in an even bit position.

23. A data demodulation system for demodulating and decoding a data signal representing data which has been encoded in accordance with the following d=2, k=7 run-length-limited code:

| DATA BITS | DEMODULATION CODE WORD |
|---|---|
| 00 | 000X |
| 01 | 0100 |
| 10 | 100X |
| 011 | 10000X |
| 111 | 100100 |
| 0000 | 10000001 | where X is either a ONE or a ZERO, as appropriate to preserve the run-length of the code and the right-most bits of the data and the code words are the first in time, the system including:
  A. data retrieval means for retrieving the data signal from a data storage device;
  B. synchronizing means for synchronizing to the data signal and assigning bit values to the signal to produce encoded data;
  C. a decoder for decoding the bits of the encoded data in groups as demodulation code words to reproduce data bits, the decoder including—
    i. first comparing means for comparing the first eight bits of the encoded data with the eight-bit demodulation code word 10000001;
    ii. first decoding means for decoding the first eight bits as a demodulation code word to produce four data bits if the comparator determines that the eight bits match the eight-bit-demodulation code word;
    iii. means for setting the first two bits of encoded data to ZEROS if the first comparing means does not determine a match;
    iv. second comparing means for comparing the first six bits of the encoded data with the six-bit demodulation code words, and if the six encoded bits do not match a code word, comparing the first four bits of the encoded data with the four-bit demodulation code words;
    iii. means for decoding the encoded data bits and producing associated data bits if the second comparator determines that the bits match the code word;
    iv. error signal means for asserting an error signal indicating an error in the first two data bits if the first four bits of encoded data do not match a demodulation code word;
  the decoder continuing to decode the bits of the encoded data as demodulation code words until the data signal retrieved from the data storage device is decoded; and
  D. transmitting means for transmitting the decoded data bits or the error signal, respectively, to a device requesting the data.

24. The data demodulation system of claim 23, wherein the system further includes means for determining the end of a demodulation code word by finding in the encoded data bits a ONE in an even bit position.

25. The data demodulation system of claim 23, wherein the synchronizing means includes means for determining the beginning of a demodulation code word by locating at least one of the following patterns in the encoded data bits;
  i. a single bit pattern of a ONE in an odd bit position followed by three ZEROS;
  ii. a ONE in an odd bit position followed by four or more ZEROS;
  iii. a bit pattern 00000100 starting at an odd bit position; or
  iv. a bit pattern 01000100 starting at an odd bit position.

26. The data demodulation system of claim 25, wherein the means for determining the beginning of a demodulation code word further includes means for:
  A. locating in the encoded data bits a repeated bit pattern of 0001 with the ONE in an odd bit position;
  B. shifting two bit positions such that the repeated pattern is interpreted as 0100; and
  C. locating in the shifted data a ONE in a predetermined bit position or a predetermined bit pattern.

27. A method of demodulating and decoding a data signal representing data which has been encoded in accordance with the following d=2, k=7 run-length-limited code:

| DATA BITS | DEMODULATION CODE WORD |
|-----------|------------------------|
| 00        | 000X                   |
| 01        | 0100                   |
| 10        | 100X                   |
| 011       | 10000X                 |
| 111       | 100100                 |
| 0000      | 10000001               | where X is either a ONE or a ZERO, as appropriate to preserve the run-length of the code and the right-most bits of the data and the code words are the first in time, said method including the steps of:
  A. retrieving the data signal from a data storage device;
  B. synchronizing to the data signal and assigning bit values to the signal to produce encoded data;
  C. decoding the bits of the encoded data in groups as demodulation code words to reproduce data bits by—
    i. comparing the first eight bits of the encoded data with the eight-bit code word 10000001;
    ii. if the bits match the code word, decoding the eight bits to produce associated data bits;
    iii. if the eight bits do not match the code word, setting the first two bits of encoded data to ZEROS;
    iv. comparing the first six bits of the encoded data with the six-bit demodulation code words;
    v. if the first six bits of the encoded data match a code word, decoding the six bits and producing associated data bits;
    iv. if the six encoded bits do not match a demodulation code word, comparing the first four bits of the encoded data with the four-bit demodulation code words and if they match, decoding the four bits and producing associated data bits;
    vii. if the first four bits of encoded data do not match a demodulation code word, asserting an error signal indicating an error in the first two data bits;
  D. transmitting the decoded data bits or the error signal, respectively, to a device requesting the data; and
  E. repeating steps A–D until the encoded data corresponding to the data signal is decoded.

28. The demodulating and decoding method of claim 27, wherein the step of synchronizing to the data signal includes determining the beginning of a demodulation code word by locating at least one of the following patterns in the bit values;
  i. a single bit pattern of a ONE in an odd bit position followed by three ZEROS;
  ii. a ONE in an ODD bit position followed by four or more ZEROS;
  iii. a bit pattern 00000100 starting at an odd bit position; or
  iv. a bit pattern 01000100 starting at an odd bit position.

29. The demodulating and decoding method of claim 28, wherein the step of synchronizing to the data signal further includes:
  A. locating in the encoded data a repeated bit pattern of 0001 with the ONE in an odd bit position;
  B. shifting two bit positions such that the repeated pattern is interpreted as 0100; and
  C. locating in the shifted data a ONE in a predetermined bit position or a predetermined pattern.

30. The demodulating and decoding method of claim 27, wherein the step of synchronizing to the data signal includes the step of determining the end of a demodulation code word by locating in the encoded data a ONE in an even bit position.

31. A method of synchronizing to, demodulating and decoding a data signal representing data which has been encoded in accordance with the following d=2, k=7 run-length-limited code:

| DATA BITS | DEMODULATION CODE WORD |
|---|---|
| 00 | 000X |
| 01 | 0100 |
| 10 | 100X |
| 011 | 10000X |
| 111 | 100100 |
| 0000 | 1000000X | where X is either a ONE or a ZERO, as appropriate to preserve the run-length of the code and the right-most bits of the data and the code words are the first in the time, said method including the steps of:
  A. retrieving the data signal from a data storage device;
  B. synchronizing to the data signal and assigning bit values to the signal by locating at least one of the following patterns in the bit values:
    i. a single bit pattern of a ONE in an odd bit position followed by three ZEROS;
    ii. a ONE in an odd bit position followed by four or more ZEROS;
    iii. a bit pattern 00000100 starting at an odd bit position; or
    iv. a bit pattern 01000100 starting at an odd bit position;
  C. decoding the bit values in groups as demodulation code words to reproduce data bits by—
    i. setting the first two bits of encoded data to ZEROS;
    ii. comparing the first eight bits of the encoded data with the eight-bit code word 10000000;
    iii. if the bits match the code word, decoding the eight bits and producing associated data bits;
    iv. if the eight bits do not match the code word, comparing the first six bits of the encoded data with the six-bit demodulation code words;
    v. if the first six bits of the encoded data match a demodulation code word, decoding the six bits and producing associated data bits;
    vi. if the six encoded bits do not match a demodulation code word, comparing the first four bits of the encoded data with the four-bit demodulation code words and if they match, decoding the four bits and producing associated data bits;
    vii. if the first four bits of encoded data do not match a demodulation code word, asserting an error signal indicating an error in the first two data bits;
  D. transmitting the decoded data bits or the error signal, respectively, to a device requesting the data; and
  E. repeating steps A–D until the encoded data corresponding to the data signal is decoded.

32. The synchronizing, demodulating and decoding method of claim 31, wherein the step of synchronizing to the data signal further includes determining the beginnings of demodulation code words by:
  A. locating in the encoded data a repeated bit pattern of 0001 with the ONE in an odd bit position;
  B. shifting two bit positions such that the repeated pattern is interpreted as 0100; and
  C. locating in the shifted data a ONE in a predetermined bit position or a predetermined pattern.

33. The synchronizing, demodulating and decoding method of claim 31, wherein the step of synchronizing to the data signal includes the step of determining the end of a demodulation code word by locating in the encoded data a ONE in an even bit position.

34. A method of synchronizing to, demodulating and decoding a data signal representing data which has been encoded in accordance with the following d=2, k=7 run-length-limited code:

| DATA BITS | DEMODULATION CODE WORD |
|---|---|
| 00 | 000X |
| 01 | 0100 |
| 10 | 100X |
| 011 | 10000X |
| 111 | 100100 |
| 0000 | 10000001 | where X is either a ONE or a ZERO, as appropriate to preserve the run-length of the code and the right-most bits of the data and the code words are the first in time, said method including the steps of:
  A. retrieving the data signal from a data storage device and assigning bit values to produce encoded data;
  B. synchronizing to the data signal to the signal by locating at least one of the following patterns in the bit values:
    i. a single bit pattern of a ONE in an odd bit position followed by three ZEROS;
    ii. a ONE in an odd bit position followed by four or more ZEROS;
    iii. a bit pattern 00000100 starting at an odd bit position; or
    iv. a bit pattern 01000100 starting at an odd bit position;
  c. decoding the bits of the encoded data in groups as demodulation code words to reproduce data bits by—
    i. setting the first two bits of encoded data to ZEROS;
    ii. comparing the first eight bits of the encoded data with the eight-bit code word 10000000;
    iii. if the bits match the code word, decoding the eight bits and producing associated data bits;
    iv. if the eight bits do not match the code word, comparing the first six bits of the encoded data with the six-bit demodulation code words;
    v. if the first six bits of the encoded data match a demodulation code word, decoding the six bits and producing associated data bits;

vi. if the six encoded bits do not match a demodulation code word, comparing the first four bits of the encoded data with the four-bit demodulation code words and if they match, decoding the four bits and producing associated data bits;
vii. if the first four bits of encoded data do not match a demodulation code word, asserting an error signal indicating an error in the first two data bits;

D. transmitting the decoded data bits or the error signal, respectively, to a device requesting the data; and E. repeating steps A-D until the encoded data corresponding to the data signal is decoded.

35. The synchronizing, demodulating and decoding method of claim 34, wherein the step of synchronizing to the data signal further includes determining the beginnings of demodulation code words by:

A. locating in the encoded data a repeated bit pattern of 0001 with the ONE in an odd bit position;
B. shifting two bit positions such that the repeated pattern is interpreted as 0100; and
C. locating in the shifted data a ONE in a predetermined bit position or a predetermined pattern.

36. The synchronizing, demodulating and decoding method of claim 34, wherein the step of synchronizing to the data signal includes the step of determining the end of a demodulation code word by locating in the encoded data a ONE in an even bit position.

37. A data demodulation system for synchronizing to, demodulating and decoding a data signal representing data which has been encoded in accordance with the following d=2, k=7 run-length-limited code:

| DATA BITS | DEMODULATION CODE WORD |
|---|---|
| 00 | 000X |
| 01 | 0100 |
| 10 | 100X |
| 011 | 10000X |
| 111 | 100100 |
| 0000 | 1000000X | where X is either a ONE or a ZERO, as appropriate to preserve the run-length of the code and the right-most bits of the data and the code words are the first in time, the system including:

A. data retrieval means for retrieving the data signal from a data storage device and assigning bit values to produce encoded data;
B. synchronzing means for synchronizing to the data signal to the signal, the synchronizing means determining the beginnings of code words by locating at least one of the following patterns in the encoded data bits:
 i. a single bit pattern of a ONE in an odd bit position followed by three ZEROS;
 ii. a ONE in an odd bit position followed by four or more ZEROS;
 iii. a bit pattern 00000100 starting at an odd bit position; or
 iv. a bit pattern 01000100 starting at an odd bit position;
the synchronizing means asserting an error signal if one of the bit patterns is not located;
C. a decoder for decoding the bits of the encoded data in groups as demodulation code words to reproduce data bits, the decoder including—
 i. first comparing means for comparing the first eight bits of the encoded data with the eight-bit demodulation code word 10000001;
 ii. first decoding means for decoding the first eight bits to produce four data bits if the comparator determines that the eight bits match the eight-bit demodulation code word;
 iii. means for setting the first two bits of encoded data to ZEROS if the first comparing means does not determine a match;
 iv. second comparing means for comparing the first six bits of the encoded data with the six-bit demodulation code words, and if the six encoded bits do not match a code word comparing the first four bits of the encoded data with the four-bit demodulation code words;
 iii. means for decoding the encoded data bits and producing associated data bits if the second comparator determines that the bits match a demodulation code word;
 iv. error signal means for asserting an error signal indicating an error in the first two data bits if the first four bits of encoded data do not match a demodulation code word;
the decoder continuing to decode the encoded data as demodulation code words until the data signal retrieved from the data storage device is decoded; and
D. transmitting means for transmitting the decoded data bits or the error signal, respectively, to a device requesting the data.

38. The data demodulation system of claim 37, wherein the synchronizing means further includes means determining the beginning of a demodulation code word by:

A. finding in the encoded data bits a repeated bit pattern of 0001 with the ONE in an odd bit position;
B. shifting two bit positions such that the repeated pattern is interpreted as 0100; and
C. locating in the shifted data a ONE in a predetermined bit position or a predetermined bit pattern.

39. The data demodulation system of claim 37, wherein the system further includes means for determining the end of a demodulation code word by locating in the encoded data bits a ONE in an even bit position.

40. A data demodulation system for synchronizing to, demodulating and decoding a data signal representing data which has been encoded in accordance with the following d=2, k=7 run-length-limited code:

| DATA BITS | DEMODULATION CODE WORD |
|---|---|
| 00 | 000X |
| 01 | 0100 |
| 10 | 100X |
| 011 | 10000X |
| 111 | 100100 |
| 0000 | 10000001 | where X is either a ONE or a ZERO, as appropriate to preserve the run-length of the code and the right-most bits of the data and the code words are the first in time, the system including:

A. data retrieval means for retrieving the data signal from a data storage device and assigning bit values to the signal to produce encoded data;

B. synchronizing means for synchronizing to the data signal, the synchronizing means determining the beginnings of code words by locating at least one of the following patterns in the encoded data bits:
  i. a single bit pattern of a ONE in an odd bit position followed by three ZEROS;
  ii. a ONE in an odd bit position followed by four or more ZEROS;
  iii. a bit pattern 00000100 starting at an odd bit position; or
  iv. a bit pattern 01000100 starting at an odd bit position;

the synchronizing means asserting an error signal if one of the bit patterns is not located;

C. a decoder for decoding the bits of the encoded data in groups as demodulation code words to reproduce data bits, the decoder including—
  i. first comparing means for comparing the first eight bits of the encoded data with the eight-bit demodulation code word 10000001;
  ii. first decoding means for decoding the first eight bits to produce four data bits if the comparator determines that the eight bits match the eight-bit demodulation code word;
  iii. means for setting the first two bits of encoded data to ZEROS if the first comparing means does not determine a match;
  iv. second comparing means for comparing the first six bits of the encoded data with the six-bit demodulation code words, and if the six encoded bits do not match a demodulation code word, comparing the first four bits of the encoded data with the four-bit demodulation code words;
  iii. means for decoding the encoded data bits and producing associated data bits if the second comparator determines that the bits match a demodulation code word;
  iv. error signal means for asserting an error signal indicating an error in the first two data bits if the first four bits of encoded data do not match a demodulation code word;

the decoder continuing to decode the bit values as demodulation code words until the data signal retrieved from the data storage device is decoded; and D. transmitting means for transmitting the decoded data bits or the error signal, respectively, to a device requesting the data.

41. The data demodulation system of claim 40, wherein the synchronizing means further includes means determining the beginning of a demodulation code word by:
  A. locating in the encoded data bits a repeated bit pattern of 0001 with the ONE in an odd bit position;
  B. shifting two bit positions such that the repeated pattern is interpreted as 0100; and
  C. locating in the shifted data a ONE in a predetermined bit position or a predetermined bit pattern.

42. The data demodulation system of claim 40, wherein the system further includes means for determining the end of a demodulation code word by locating in the encoded data bits a ONE in an even bit position.

* * * * *